US012772428B2

(12) United States Patent
Ori

(10) Patent No.: US 12,772,428 B2
(45) Date of Patent: Oct. 20, 2026

(54) ELECTROMAGNETIC WAVE SHIELDING MATERIAL, COVERING MATERIAL OR EXTERIOR MATERIAL, AND ELECTRIC/ELECTRONIC APPARATUS

(71) Applicant: JX Advanced Metals Corporation, Tokyo (JP)

(72) Inventor: Yuki Ori, Ibaraki (JP)

(73) Assignee: JX Advanced Metals Corporation, Tokyo (JP)

( * ) Notice: Subject to any disclaimer, the term of this patent is extended or adjusted under 35 U.S.C. 154(b) by 139 days.

(21) Appl. No.: 18/856,377

(22) PCT Filed: May 24, 2023

(86) PCT No.: PCT/JP2023/019389

§ 371 (c)(1),
(2) Date: Oct. 11, 2024

(87) PCT Pub. No.: WO2024/018752

PCT Pub. Date: Jan. 25, 2024

(65) Prior Publication Data

US 2025/0261354 A1 Aug. 14, 2025

(30) Foreign Application Priority Data

Jul. 20, 2022 (JP) ................................ 2022-115828

(51) Int. Cl.

*H05K 9/00* (2006.01)
*B32B 15/04* (2006.01)
*B32B 15/20* (2006.01)

(52) U.S. Cl.

CPC ........... *H05K 9/0088* (2013.01); *B32B 15/04* (2013.01); *B32B 15/20* (2013.01); *H05K 9/0075* (2013.01);

(Continued)

(58) Field of Classification Search

None

See application file for complete search history.

(56) References Cited

U.S. PATENT DOCUMENTS

| | | | |
|---|---|---|---|
| 2021/0242137 | A1 | 8/2021 | Matsudo et al. |
| 2024/0057305 | A1 | 2/2024 | Yamamoto |

FOREIGN PATENT DOCUMENTS

| | | | |
|---|---|---|---|
| CN | 102504495 | A | 6/2012 |
| CN | 105624588 | A | 6/2016 |

(Continued)

OTHER PUBLICATIONS

Office Action in TW Application No. 112122674 dated Aug. 6, 2024, 12 pages.

(Continued)

*Primary Examiner* — Xiaobei Wang

(74) *Attorney, Agent, or Firm* — MARSHALL, GERSTEIN & BORUN LLP

(57) ABSTRACT

Provided is an electromagnetic wave shielding material that can satisfactorily suppress cracks or the like during use (especially during bending) as an electromagnetic wave shielding material. The electromagnetic wave shielding material including a laminate having at least one non-magnetic conductive metal layer and at least one ferromagnetic layer laminated together, wherein at least one outermost layer of the laminate is the non-magnetic conductive metal layer, and wherein, when the electromagnetic wave shielding material is bent at a radius of curvature of 0.1 mm with an outermost non-magnetic conductive metal layer outside, a bending neutral axis is located within a thickness of the outermost non-magnetic conductive metal layer.

6 Claims, 2 Drawing Sheets

(52) U.S. Cl.
CPC ..... *B32B 2250/02* (2013.01); *B32B 2307/202* (2013.01); *B32B 2307/208* (2013.01); *B32B 2307/212* (2013.01); *B32B 2307/54* (2013.01); *B32B 2307/7376* (2023.05); *B32B 2311/12* (2013.01); *B32B 2311/24* (2013.01); *B32B 2457/00* (2013.01)

(56) References Cited

FOREIGN PATENT DOCUMENTS

| | | | |
|---|---|---|---|
| CN | 109195432 | A | 1/2019 |
| EP | 3886550 | A1 | 9/2021 |
| JP | 2014-057043 | A | 3/2014 |
| JP | 2019-009396 | A | 1/2019 |
| JP | 2021-028940 | A | 2/2021 |
| KR | 2021-0002738 | A | 1/2021 |
| WO | WO-2019/107883 | A1 | 6/2019 |
| WO | WO-2022/123864 | A1 | 6/2022 |

OTHER PUBLICATIONS

International Preliminary Report on Patentability and Written Opinion in International Application No. PCT/JP2023/019389 dated Dec. 18, 2024, 4 pages.
Office Action in KR Application No. 10-2024-7029492 dated Aug. 19, 2025, 13 pages.
Extended European Search Report in EP Application No. 23842684.5 dated Oct. 13, 2025, 10 pages.
Search Report in International Application No. PCT/JP2023/019389 dated Aug. 29, 2023, 4 pages.

[FIG. 1]
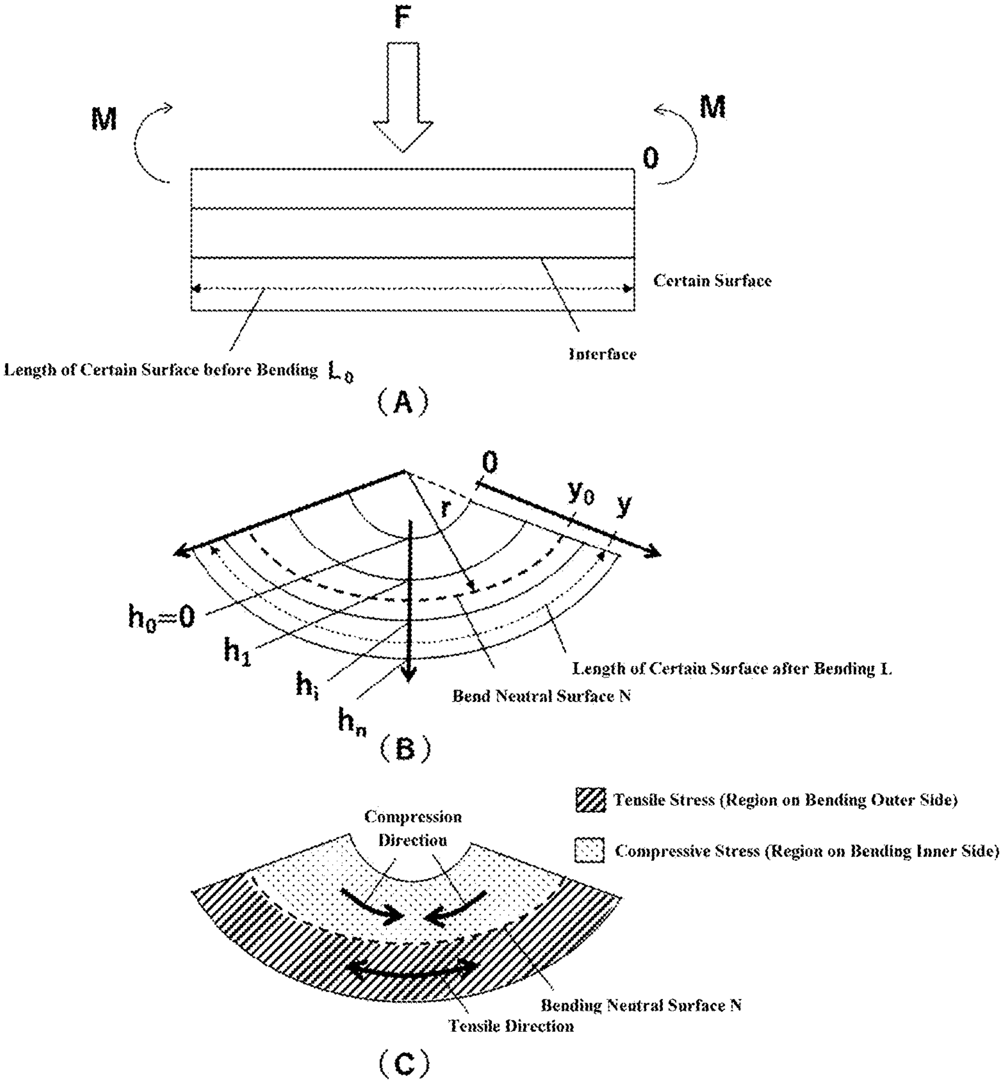

[FIG. 2]
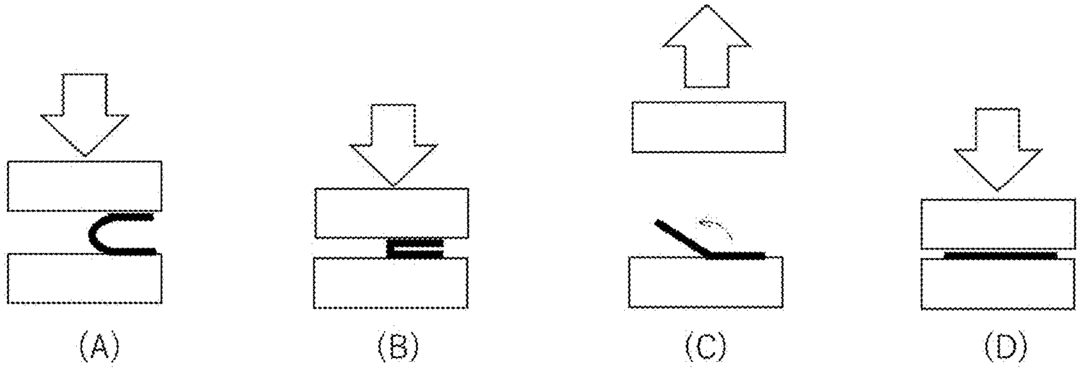
[FIG. 3]
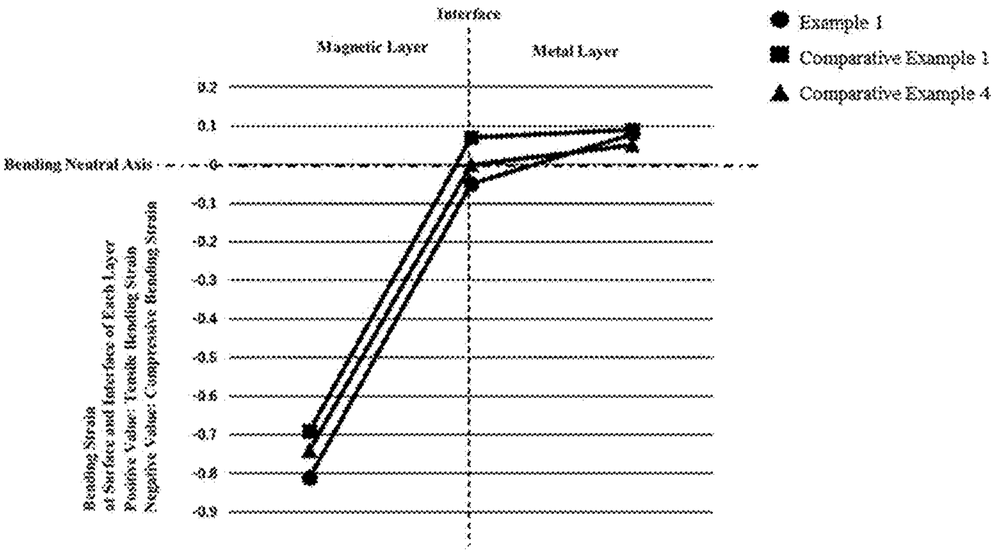

ELECTROMAGNETIC WAVE SHIELDING MATERIAL, COVERING MATERIAL OR EXTERIOR MATERIAL, AND ELECTRIC/ELECTRONIC APPARATUS

CROSS-REFERENCE TO RELATED APPLICATION

This is the US national phase of International Patent Application No. PCT/JP2023/019389 filed May 24, 2023, which claims the priority benefit of JP Patent Application No. 2022-115828 filed on Jul. 20, 2022, the entire respective disclosures of which are incorporated herein by reference.

FIELD OF THE INVENTION

The present invention relates to an electromagnetic wave shielding material, a covering material or an external material, and an electric/electronic apparatus.

BACKGROUND OF THE INVENTION

Many environmentally friendly vehicles equipped with secondary batteries, such as electric vehicles and hybrid vehicles, use a system in which the DC current generated by the installed secondary batteries is converted to AC current via an inverter, and the necessary power is then supplied to an AC motor to obtain driving power, and electromagnetic waves are generated due to the switching operation of the inverter, and the like.

In addition, electromagnetic waves are emitted from many electrical and electronic apparatuses, including communication devices, displays, and medical devices, in addition to automobiles. The electromagnetic waves can cause malfunctions in precision devices, and there are also concerns about their effects on the human body.

Typically, in a higher frequency range (1 MHz or more), conductive layers such as copper are known to exhibit good shielding properties against the electromagnetic waves. However, in a lower frequency range (less than 1 MHz), only the conductive layer such as copper results in lower shielding properties against the electromagnetic waves, so it is known that electromagnetic wave shielding materials having alternating layers of magnetic and conductive layers with excellent magnetic permeability exhibit good shielding properties against electromagnetic waves.

The following technique is proposed in Patent Literature 1, for example: "A noise suppression sheet used to suppress a noise of 1 MHz or less, the noise suppression sheet comprising: a noise suppression layer having n magnetic layers having a magnetic layer ($A_1$) and a magnetic layer ($A_n$); and at least (n−1) conductive layers, the magnetic layers and the conductive layers being alternately laminated, wherein each of the magnetic layers has Xi expressed in the following equation (1) of 1 or more, wherein the total of $X_i$ of the magnetic layers is 4 or more and 15 or less, and each of the conductive layers has a proportionality constant of 4 or more obtained when linearly approximating a shielding property of 0.2 to 1 MHz in magnetic field shielding measurement using an KEC method:

$$X_i = \sqrt{\mu'_i} \times \sqrt{t_i} \quad \text{Equation (1)}$$

in which n is an integer greater than or equal to 2, i is an integer greater than or equal to 1 and less than or equal to n, $\mu'_i$ is a relative magnetic permeability at 1 MHz of the magnetic layer (Ai), and $t_i$ is a thickness of the magnetic layer ($A_i$) [mm]."

CITATION LIST

Patent Literature

[Patent Literature 1] Japanese Patent Application Publication No. 2021-028940 A

SUMMARY OF THE INVENTION

By the way, electromagnetic wave shielding materials are sometimes used by attaching them to housings, electronic components, and the like. During use, the electromagnetic wave shielding materials are bent depending on the shapes of the housings or components, so that electromagnetic wave shielding materials with excellent bending characteristics, such as bending close to 180° or bending multiple times, may be required.

Materials with high specific magnetic permeability generally used for the magnetic layers of electromagnetic wave shielding materials are often brittle, and cracks may be generated in the entire thickness direction of the magnetic layer when the electromagnetic wave shielding material is bent. Also, the layer bonded to other layers may float due to bending. Such phenomena can be a factor that reduces the electromagnetic wave shielding effect in the noise frequency band. It should be noted that Patent Literature 1 does not focus on the bending characteristics as described above.

Therefore, in one embodiment of the present invention, an object of the present invention is to provide an electromagnetic wave shielding material that can satisfactorily suppress cracks or the like during use (especially during bending) as an electromagnetic wave shielding material.

As a result of intensive studies for solving the above problems, the present inventors have found that it is effective that at least one of the outermost layers of a laminate having a ferromagnetic layer and a non-magnetic conductive metal layer laminated together is the non-magnetic conductive metal layer, and that when the outermost nonmagnetic conductive metal layer is bent at a radius of curvature of 0.1 mm with the outermost nonmagnetic conductive metal layer facing the outside, a bending neutral axis is located within a thickness of the outermost non-magnetic conductive metal layer, and they have created the inventions exemplified as follows:

[1]

An electromagnetic wave shielding material comprising a laminate having at least one non-magnetic conductive metal layer and at least one ferromagnetic layer laminated together, wherein at least one outermost layer of the laminate is the non-magnetic conductive metal layer, and wherein, when the electromagnetic wave shielding material is bent at a radius of curvature of 0.1 mm with an outermost non-magnetic conductive metal layer outside, a bending neutral axis is located within a thickness of the outermost non-magnetic conductive metal layer.

[2]

The electromagnetic wave shielding material according to [1], wherein the other outermost layer of the laminate is the ferromagnetic layer.

[3]

The electromagnetic wave shielding material according to [1] or [2], wherein a Young's modulus of each non-magnetic conductive metal layer is higher than that of each ferromagnetic layer, and wherein a thickness of each non-magnetic conductive metal layer is lower than that of each ferromagnetic layer.

[4]

The electromagnetic wave shielding material according to any one of [1] to [3], wherein the non-magnetic conductive metal layer comprises at least one selected from copper, a copper alloy, aluminum, and an aluminum alloy.

[5]

A covering material or an exterior material for electrical and electronic apparatuses, the covering material or the exterior material comprising the electromagnetic wave shielding material according to any one of [1] to [4].

[6]

An electrical and electronic apparatus comprising the covering material or the exterior material according to [5].

According to one embodiment of the invention, it is possible to satisfactorily suppress cracks or the like during use (especially during bending) as an electromagnetic wave shielding material.

BRIEF DESCRIPTION OF THE DRAWINGS

FIGS. 1 (A) and (B) are schematic views each illustrating a position of a bending neutral axis for a laminate, and FIG. 1 (C) is a schematic view illustrating directions of tensile stress and compressive stress acting when a laminate is bent;

FIGS. 2 (A) to (D) are schematic views each illustrating a seam folding test; and FIG. 3 is a graph illustrating an expected bending strain of each layer of electromagnetic wave shielding materials obtained in Example 1 and Comparative Examples 1 and 4.

DETAILED DESCRIPTION OF THE INVENTION

The present invention is not limited to each of the following embodiments, but it can be embodied by modifying its components to the extent that it does not depart from the spirit of the present invention. Also, various inventions can be formed by appropriate combinations of a plurality of components disclosed in each embodiment.

As used herein, a "bending neutral surface" means a surface on which neither compressive stress nor tensile stress are generated when a bending moment is generated in an electromagnetic shielding material, and a "bending neutral axis" means an intersection line between any cross section of the electromagnetic shielding material and the bending neutral surface.

Electromagnetic Wave Shielding Material

In an embodiment, the electromagnetic wave shielding material according to the present invention includes a laminate having at least one ferromagnetic layer and at least one non-magnetic conductive metal layer laminated together. Further, at least one outermost layer of the electromagnetic wave shielding material is the non-magnetic conductive metal layer, and when the electromagnetic wave shielding material is bent at a radius of curvature of 0.1 mm with the outermost non-magnetic conductive metal layer outside, the bending neutral axis is located within the thickness of the outermost nonmagnetic conductive metal layer.

In the present invention, it is sufficient to use a material that has substantially no variation (within the allowable variation range of ±2.5%) in the thicknesses of each non-magnetic conductive metal layer and each ferromagnetic layer. For example, the shape of each layer can be a sheet and a foil.

The electromagnetic wave shielding material may be used by bending as described above. By this bending, compressive stress may act on the bending inner side from the bending neutral surface because the bending inner side will have a shorter length than that before the bending deformation, and tensile stress may act on the bending outer side from the bending neutral surface because the bending outer side will have a longer length than that before the bending deformation. In particular, when the electromagnetic wave shielding material is bent at a relatively low radius of curvature, the layer that will be the bending outer side is prone to cracking due to the tensile stress. Such a breakage can cause a decrease in shielding effectiveness, as described above.

Therefore, in an embodiment, by controlling the Young's modulus and thickness of each layer of the laminate of the electromagnetic wave shielding material as appropriate, the bending neutral axis when bent at a relatively low bending radius is located within the thickness of the outermost non-magnetic conductive metal layer, thereby enabling cracking caused by bending (for example, bending when the material is attached to a housing or an electronic component and used) to be suppressed.

Next, the position of the bending neutral axis is described with reference to FIGS. 1 (A), (B) and (C). For example, when the bending acts by an external force F in the thickness direction of the laminate, a bending moment M is generated, and compressive stress (−σ) acts on a region of a bending inner side from a bending neutral surface N, and tensile stress (+σ) acts on a region of a bending outer side from the bending neutral surface N. As shown in FIG. 1 (C), the tensile stress herein is the stress acting from the bending neutral surface N to the region of the bending outer side in the direction of pulling toward the side surface side of that region (tensile direction), and the compressive stress is the stress acting from the bending neutral surface N to the region of the bending inner side in the direction opposite to the pulling direction for the tensile stress (compressive direction). Based on this, the position of the bending neutral surface where the stress is 0 (zero) is calculated from the Young's modulus of each layer, the thickness of each layer, the length $L_0$ of a certain surface before bending deformation, and the length displacement ΔL of a certain surface before and after bending deformation, according to the following equations I to V. The ratio of the length displacement ΔL of the certain surface before and after the bending deformation to the length Lo of the certain surface before the bending deformation, "$\Delta L/L_0$", shown in the following equation I, is an amount of strain on the certain surface in the laminate after bending. Since neither tensile stress nor compressive stress acts on the bending neutral axis, the length of the bending neutral axis does not change before and after the bending deformation. In other words, the amount of strain can be calculated by considering the ratio of the difference between the length of the bending neutral axis and the length of the certain surface in the laminate and the length of the bending neutral axis. As shown in the equation II below, the total stress acting on a small area dA is 0 (zero) because it is the sum of the tensile stress and the compressive stress, and this is also the case when i layers are laminated (see equation III). Also, from Hooke's law "σ=Eε", the stress σ can be expressed as the product of Young's modulus E and the strain amount ε. Therefore, from this and the equation I, the equation III can be transformed into the equation IV. Then, in order to determine the position of the bending neutral axis, the equation IV is transformed into the equation V. Then, by substituting a numerical value corresponding to each parameter into the equation V, the position of the bending neutral surface can be determined. As a result, the resulting value of "$y_0$" indicates the position of the bending neutral axis.

[Equation I]

(Strain Amount on Certain Surface in Lanminate after Bending Deformation)

$$\varepsilon = \frac{\Delta L}{L_0} = \frac{(r + y - y_0)d\theta - \text{rd}\,\theta}{\text{rd}\,\theta} = \frac{y - y_0}{r} \qquad \text{Equation I}$$

$\varepsilon$: Bending Strain (Dimensionless)

$L_0$: Length of Certain Surface before Bending Deformation ($\mu m$)

$L$: Length of Certain Surface after Bending Deformation ($\mu m$)

$\Delta L$: Displacement of Length of Certain Surface before and after Bending Deformation ($\mu m$)

$r$: Distance from Bending Center to Bending Neutral Surface ($\mu m$)

$y_0$: Shortest Distance from Inner Surface of Bending to Bending Neutral Surface ($\mu m$)

$y$:
Shortest Distance from Bending Inner Surface to Certain Surface after Bending Deformation ($\mu m$)

$\theta$: Angle Formed by Two Surface separated by $r$ ($\circ$)

[Equation II]

$$\int_A \sigma\, dA = 0 \qquad \text{Equation II}$$

$\sigma$: Stress ($GPa$)

$A$: Area $(\mu m^2)$ $$\sum_{j=0}^{n} \int_{h_i}^{h_{i+1}} \sigma_j dA = 0 \qquad \text{Equation III}$$

$\sigma_j$ = Stress of $i{-}th$ Laminated Material from Bending Inner Side ($Gpa$)

$A$: Area $(\mu \text{m}^2)$ $h_j$: Total Thickness of Material Laminated from Bending Inner Side to $i{\sim}th$ ($\mu m$)

$h_{i+1}$: Total Thickness of Material Laminated from Bending Inner Side to $i + 1 - th$ ($\mu m$)

[Equation IV]

$$\sum_{j=0}^{n} \int_{h_i}^{h_{i+1}} E_i \frac{y - y_0}{r} dy = 0 \qquad \text{Equation IV}$$

$E_i$ = Young's Modulus of $i{-}th$ Material from Bending Inner Side ($Gpa$)

$r$: Distance from Bending Center to Bending Neutral Surface ($\mu$m)

$y_0$: Shortest Distance from Bending Inner Surface to Bending Neutral Surface ($\mu m$)

$h_j$: Total Thickness of Material Laminated from Bending Inner Side to $i{-}th$ ($\mu m$)

$h_{j+1}$: Total Thickness of Material Laminated from Bending Inner Side to $i + 1{-}th$ ($\mu m$)

[Equation V]

(Tranforming Equation $IV$ into Equation for Determining Position of Bending Neutral Axis)

$$y_0 = \frac{\sum_{j=1}^{n} E_j\left(h_j^2 - h_{i-1}^2\right)}{2\sum_{j=1}^{n} E_j h_i} \qquad \text{Equation V}$$

-continued $E_i$ = Young's Modulus of $i-th$ Material from Bending Inner Side $(Gpa)$ $h_j$ : Total Thickness of Material Laminated from Bending Inner Side to $i-th$ $(\mu m)$ $h_{j-1}$ : Total Thickness of Material Laminated from Bending Inner Side to $i+1-th$ $(\mu m)$ $y_0$ : Shortest Distance from Bending Inner Surface to Bending Neutral Surface $(\mu m)$ In an embodiment, the other outermost layer of the laminate is preferably a ferromagnetic layer in order to suppress cracking during bending. In terms of shielding properties, the ferromagnetic layer may be laminated through at least two non-magnetic conductive metal layers. Also, at least one surface of the non-magnetic conductive metal layer may further have a treated film made of an alloy containing copper, and both of the surfaces of the non-magnetic conductive metal layer may further have the above treated film. In this case, it is preferable that the treated film is disposed via the ferromagnetic layer and the non-magnetic conductive metal layer, from the viewpoint of efficient absorption and attenuation of electromagnetic waves in the ferromagnetic layer. The treated film is formed, for example, on the surface on the non-magnetic conductive metal layer side of the ferromagnetic layer adjacent to the non-magnetic conductive metal layer. From the viewpoint of shielding properties, it is also preferable that at least one outermost film (uppermost film and/or lowermost film) of the electromagnetic wave shielding material is a treated film formed on the non-magnetic conductive metal layer.

<Ferromagnetic Layer>

The ferromagnetic layer has electromagnetic wave absorption properties and has a specific magnetic permeability of approximately 10 to 50000 at a frequency of 1 MHz. The ferromagnetic layer contains a magnetic metal material with high specific magnetic permeability, and examples of the material include a composite sheet formed by mixing and dispersing the magnetic metal material and a resin, a metal foil, and a laminate having high specific magnetic permeability while laminating a resin sheet on at least one surface of the metal foil, and so on. The composite sheet is preferred from the viewpoint of bonding properties with the non-magnetic conductive metal layer and reducing strain of the material when processed such as bending.

A known method of measuring the specific magnetic permeability can be adopted. One example is the method of measuring magnetic permeability using a B-H curve tracer (reference: JIS C2560-2:2006).

When the ferromagnetic layer is the composite sheet or the laminate of the metal foil and the resin sheet, the resin includes natural and synthetic resins, and the synthetic resins are preferred from the viewpoint of processability. These materials can also be mixed with fiber-reinforced materials such as carbon fiber, glass fiber and aramid fiber.

The synthetic resins include polyesters such as PET (polyethylene terephthalate), PEN (polyethylene naphthalate) and PBT (polybutylene terephthalate); olefinic resins such as polyethylene and polypropylene; polyamides; PIs (polyimides); LCPs (liquid crystal polymers); polyacetals; fluororesins; polyurethanes; acrylic resins; epoxy resins; silicone resins; phenol resins; melamine resins; ABS resins; polyvinyl alcohols; urea resins; polyvinyl chloride; PC (polycarbonate); polystyrenes; styrene butadiene rubbers, etc., from the viewpoint of availability and processability, and among these, PET, PEN, polyamide, and PI are preferred for reasons of processability and costs. The synthetic resins can also be elastomers such as urethane rubbers, chloroprene rubbers, silicone rubbers, fluororubbers, styrene-based, olefin-based, polyvinyl chloride-based, urethane-based, and amide-based elastomers. Furthermore, the synthetic resin itself may play the role of an adhesive, and in this case, it forms a structure in which the non-magnetic conductive metal layers is laminated via the adhesive. Non-limiting examples of the adhesives include acrylic resin-based, epoxy resin-based, urethane-based, polyester-based, silicone resin-based, vinyl acetate-based, styrene butadiene rubber-based, nitrile rubber-based, phenol resin-based, and cyanoacrylate-based adhesives, and the urethane-based, polyester-based, and vinyl acetate-based adhesives are preferred for the reasons of ease of production and costs.

The composite sheet can be laminated in a form of a film or fiber. The composite sheet can also be formed by applying an uncured, mixed composition of a magnetic metal material and a resin to the surface of the non-magnetic conductive metal layer or the treated film and then curing it, but a composite sheet that can be affixed to the surface of the non-magnetic conductive metal layer or the treated film is preferred for reasons of ease of production. For example, the PET film is suitably used. The strength of the electromagnetic wave shielding material can be increased by using a biaxially oriented film as the PET film.

In addition, the mass ratio of the resin and the magnetic metal material in the composite sheet is, for example, 70:30 to 1:99.

When the ferromagnetic layer is a metal foil, the ferromagnetic layer more preferably contains at least one selected from nickel, iron, Permalloy (Ni—Fe alloy) and Sendust (Fe—Si—Al alloy). Since these materials have relatively high specific magnetic permeability, they can collect the magnetic flux components in the noise and reduce the spatial magnetic field.

Further, in an embodiment, from the viewpoint of suppressing cracks and the like that are generated during bending, the Young's modulus of the ferromagnetic layer is, for example, 0.2 to 10 GPa. Such a numerical range allows the bending neutral axis during certain bending to be located within the thickness of the outermost non-magnetic conductive metal layer.

The lower limit of the above Young's modulus is, for example, 0.2 GPa or more, for example, 0.25 GPa or more, or for example 0.3 GPa or more. On the other hand, the upper limit of the above Young's modulus is, for example, 10 GPa or less, or for example 4 GPa or less.

It should be noted that one example of a method for measuring the Young's modulus of the ferromagnetic layer is a static measurement method, and the measurement method described in Examples of this specification can be adopted.

Furthermore, in an embodiment, from the viewpoint of suppressing cracks and the like that are generated during bending, the thickness of the ferromagnetic layers is, for example, 5 to 200 μm per layer. Such a numerical range allows the bending neutral axis during certain bending to be located within the thickness of the outermost non-magnetic conductive metal layer.

The lower limit of the thickness per layer is, for example, 5 μm or more, for example, 20 μm or more. On the other hand, the upper limit of the thickness per layer is, for example, 200 μm or less, for example, 100 μm or less.

An example of a method for measuring the thickness of the ferromagnetic layer uses a constant pressure thickness gauge (PG-20J, manufactured by TECLOCK) in accordance with JIS K6250:2019.

In an embodiment, when multiple ferromagnetic layers are formed, all the ferromagnetic layers may be made of the same material, or may be made of different materials for each layer. Also, all the ferromagnetic layers may have the same thickness, or different thicknesses for each layer.

Therefore, in the electromagnetic wave shielding material according to one embodiment of the present invention, the total thickness of the ferromagnetic layers is, for example, 5 to 300 μm.

The lower limit of the total thickness is, for example, 5 μm or more, for example, 15 μm or more. On the other hand, the upper limit of the total thickness is, for example, 300 μm or less, and, for example, 200 μm or less.

<Non-Magnetic Conductive Metal Layer>

The non-magnetic conductive metal layer is composed of a conductive metal material that exhibits antimagnetic or paramagnetic substances. In one embodiment, the material of the non-magnetic conductive metal layer to be used is not particularly limited, but from the viewpoint of enhancing shielding properties with respect to alternating magnetic fields and alternating electric fields, it is preferably a metal material with improved electrical conductivity. Specifically, it is preferably formed of a material having an electrical conductivity of $1.0\times10^6$ S/m (which is a value at 20° C.; the same applies hereinafter), and more preferably an electrical conductivity of $10.0\times10^6$ S/m or more, and even more preferably an electrical conductivity of $30.0\times10^6$ S/m or more, and most preferably an electrical conductivity of $50.0\times10^6$ S/m or more. Such metals include aluminum having an electrical conductivity of about $39.6\times10^6$ S/m, and copper having an electrical conductivity of about $58.0\times10^6$ S/m. In other words, it is suitable that the non-magnetic conductive metal layer contains at least one selected from copper, copper alloys, aluminum, and aluminum alloys, in view of both conductivity and cost. These are preferred for practicality.

Furthermore, in an embodiment, from the viewpoint of suppressing cracks and the like that are generated during bending, the Young's modulus of each non-magnetic conductive metal layer may be higher than that of each ferromagnetic layer, for example, it is 40 to 250 GPa.

The lower limit of the Young's modulus is, for example, 40 GPa or more, for example 60 GPa or more, for example 70 GPa or more, or for example 80 GPa or more. On the other hand, the upper limit of the Young's modulus is, for example, 250 GPa or less, for example 200 GPa or less.

An example of a method for measuring the Young's modulus of the non-magnetic conductive metal layer include a resonance method and a static measurement method, and the measurement methods described in Examples of this specification can be adopted.

In an embodiment, from the viewpoint of suppressing cracks and the like that are generated during bending, the thickness of each non-magnetic conductive metal layer is preferably lower than that of each ferromagnetic layer, and it is, for example, 6 to 150 μm per layer. Such a numerical value allows the bending neutral axis during certain bending to be located within the thickness of the outermost non-magnetic conductive metal layer. Also, the non-magnetic conductive metal layer has appropriate ductility and good moldability.

The lower limit of the thickness per layer is, for example, 6 μm or more, or 12 μm or more. On the other hand, the upper limit o df the thickness per layer is, for example, 150 μm or less, for example, 105 μm or less.

The thickness of the non-magnetic conductive metal layer is measured by punching out a sample with a precision cutter to a length of 150 mm and a width of 12.7 mm, and converting the results obtained by measuring the weight of five punched samples into a thickness. For example, for rolled copper foil and electrodeposited copper foil, samples are prepared as described above, and their weights are measured, and are converted into a thickness based on the specific gravity of copper. For aluminum foil and the like, the thickness is measured using a constant pressure thickness gauge (PG-20J, manufactured by TECLOCK) in accordance with JIS K6250:2019.

In an embodiment, when multiple non-magnetic conductive metal layers are formed, all the non-magnetic conductive metal layers may be made of the same material, or different materials may be used for each layer, and all the non-magnetic conductive metal layers may have the same thickness, or have different thicknesses for each layer.

In an embodiment, the total thickness of the non-magnetic conductive metal layers is, for example, 6 to 450 μm.

The lower limit of the total thickness is, for example, 6 μm or more, for example, 18 μm or more. On the other hand, the upper limit of the total thickness is, for example, 450 μm or less, for example, 315 μm or less.

The non-magnetic conductive metal layer is not limited to any particular shape, but an example is a metal foil. When copper foil is used as the metal foil, it should be of high purity, and it preferably has a purity of 99.5% by mass or more, more preferably 99.8% by mass or more, as it improves shielding properties. A rolled copper foil, electrodeposited copper foil, and metallized copper foil can be used as the copper foil, and the rolled copper foil is preferred because of its superior bendability and formability. When alloying elements are added to the copper foil to make the copper alloy foil, the total content of these elements and unavoidable impurities may be less than 0.5% by mass. In particular, a total content of 50 to 2000 ppm by mass of at least one selected from tin, manganese, chromium, zinc, zirconium, magnesium, nickel, silicon, and silver, and/or 10 to 50 ppm by mass of phosphorus in the copper foil is/are preferable because it improves elongation compared to a pure copper foil having the same thickness.

<Treated Film>

From the viewpoint of enhancing shielding properties, the treated film may further include one or more selected from electromagnetic wave absorption auxiliary films of an alloy containing copper, heat resistant films, rust preventive films, and weather resistant films, which are formed on at least one surface of the non-magnetic conductive metal layer. The heat resistant-treated heat resistant films include plated films and vapor-deposited films containing cobalt and/or nickel, and the like, and the rust preventive-treated rust preventive films include inorganic plated films and vapor-deposited films such as zinc and chromium, and organic films such as benzotriazole, and the silane coupling-treated weather resistant films include organic coated films containing silane coupling agents. In other words, one or more metals selected from zinc, molybdenum, tin, phosphorus, tungsten, chromium, and silicon may be further included in the treated film in addition to copper, cobalt and nickel.

In addition, when the ferromagnetic layer is a composite sheet containing a resin, the treated film interposed between the ferromagnetic layer and the non-magnetic conductive metal layer can also improve adhesiveness between the ferromagnetic layer and the non-magnetic conductive metal layer.

The electromagnetic wave absorption auxiliary film can be produced by known methods, such as plating, metal deposition, and sputtering. In particular, a method of forming an electromagnetic wave absorption auxiliary film composed of copper, cobalt and nickel by plating on the surface of the non-magnetic conductive metal layer is described below as an example.

In the plating process to form the electromagnetic wave absorption auxiliary film, a particle film consisting of cobalt and nickel is formed on at least one surface of the non-magnetic conductive metal layer.

(Plating Conditions (Roughening Plating Process): Plating of Copper, Cobalt and Nickel Alloy)

An example of the plating conditions for copper, cobalt, and nickel is as follows:

- Liquid composition: 10 to 20 g/L of copper, 5 to 15 g/L of cobalt, 5 to 15 g/L of nickel;
- pH: 2 to 3;
- Liquid temperature: 30 to 50° C.;
- Current density: 10 to 60 A/dm$^2$; and
- Coulomb amount: 10 to 48 As/dm$^2$.

In this case, the roughening plating process can be performed in multiple stages under the above plating conditions.

(Mass Ratio, Adhesion Amount)

The mass ratio of cobalt in each treated film is preferably 1.50 to 4.50 when the mass ratio of nickel in each treated film is 1. The lower limit of the above cobalt mass ratio is, for example, 1.50 or more, 1.80 or more, or 1.90 or more. The upper limit of the above mass ratio of cobalt is, for example, 4.50 or less, 4.20 or less.

The mass ratio in the treated film as described above can be determined based on the following equation (1):

Mass ratio of cobalt in each treated film assuming that the mass ratio of nickel in each treated film is 1=[a deposited amount of Co in treated film (μg/dm$^2$)/a deposited amount of Ni in treated film (μg/dm$^2$)]. (1)

In the heat resistant treatment, at least one of the following heat resistant films 1-8 can be further formed on the electromagnetic wave absorption auxiliary film as described above. The respective plating and deposition conditions are shown below.

(Plating Conditions for Heat Resistant Film 1) (Co—Ni Plating: Plating of Cobalt-Nickel Alloy)

- Liquid composition: 5 to 20 g/L of nickel, 1 to 8 g/L of cobalt;
- pH: 2 to 3;
- Liquid temperature: 40 to 60° C.;
- Current density: 10 to 30 A/dm$^2$; and
- Coulomb amount: 2 to 20 As/dm$^2$.

(Plating Conditions for Heat Resistant Film 2) (Ni—Zn Plating: Plating of Nickel-Zinc Alloy)

- Liquid composition: 2 to 30 g/L of nickel, 2 to 30 g/L of zinc;
- pH: 3 to 4;
- Liquid temperature: 30 to 50° C.;
- Current density: 1 to 10 A/dm$^2$; and
- Coulomb amount: 0.5 to 2 As/dm$^2$.

(Plating Conditions for Heat Resistant Film 3) (Ni—Cu Plating: Plating of Nickel-Copper Alloy)

- Liquid composition: 2 to 30 g/L of nickel, 2 to 30 g/L of copper;
- pH: 3 to 4;
- Liquid temperature: 30 to 50° C.;
- Current density: 1 to 2 A/dm$^2$; and
- Coulomb amount: 1 to 2 As/dm$^2$.

(Plating Conditions for Heat Resistant Film 4) (Ni—Mo Plating: Plating of Nickel-Molybdenum Alloy)

- Liquid composition: Ni sulfate hexahydrate: 45 to 55 g/dm$^3$, sodium molybdate dihydrate: 50 to 70 g/dm$^3$, sodium citrate: 80 to 100 g/dm$^3$;
- Liquid temperature: 20 to 40° C.;
- Current density: 1 to 4 A/dm$^2$; and
- Coulomb amount: 1 to 2 As/dm$^2$.

(Plating Conditions for Heat Resistant Film 5) (Ni—Sn Plating: Plating of Nickel-Tin Alloy)

- Liquid composition: 2 to 30 g/L of nickel, 2 to 30 g/L of tin;
- pH: 1.5 to 4.5;
- Liquid temperature: 30 to 50° C.;
- Current density: 1 to 2 A/dm$^2$; and
- Coulomb amount: 1 to 2 As/dm$^2$.

(Plating Conditions for Heat Resistant Film 6) (Ni—P Plating: Plating of Nickel-Phosphorus Alloy)

- Liquid composition: 30 to 70 g/L of nickel, 0.2 to 1.2 g/L of phosphorus;
- pH: 1.5 to 2.5;
- Liquid temperature: 30 to 40° C.;
- Current density: 1 to 2 A/dm$^2$; and
- Coulomb amount: 1 to 2 As/dm$^2$.

(Plating Conditions for Heat Resistant Film 7) (Ni—W Plating: Plating of Nickel-Tungsten Alloy)

- Liquid composition: 2 to 30 g/L of nickel, 0.01 to 5 g/L of tungsten;
- pH: 3 to 4;
- Liquid temperature: 30 to 50° C.;
- Current density: 1 to 2 A/dm$^2$; and
- Coulomb amount: 1 to 2 As/dm$^2$.

(Deposition Conditions for Heat Resistant Film 8) (Ni—Cr Deposition: Deposition of Nickel-Chromium Alloy)

A nickel-chromium alloy deposition film is formed using a sputtering target having a composition of 65 to 85 mass % of nickel and 15 to 35 mass % of chromium.

- Target: 65 to 85 mass % of nickel, 15 to 35 mass % of chromium.
- Equipment: Sputtering equipment manufactured by ULVAC Inc.
- Output: DC 50W; and
- Argon pressure: 0.2 Pa.

In the rust preventive treatment, the following rust preventive film and/or weather resistant film can be further formed on the electromagnetic wave absorption auxiliary film or the heat resistant film as described above. Each condition is shown below.

(Plating Conditions for Rust Preventive Film)

- Liquid composition: 1 to 10 g/L of potassium dichromate, 0.2 to 0.5 g/L of zinc;
- pH: 3 to 4;
- Liquid temperature: 50 to 70° C.;
- Current density: 0 to 2 A/dm$^2$ (0 A/dm$^2$ is for immersion chromate treatment.); and
- Coulomb amount: 0 to 2 As/dm$^2$ (0 As/dm$^2$ is for immersion chromate treatment.)

(Type of Weather Resistant Film (Silane Coupling Film))

One example is the application of an aqueous diaminosilane solution or an aqueous epoxysilane solution.

If the metal film or the plated film such as heat resistant films is provided by vapor deposition (dry plating) such as sputtering, and if the metal film or the plated film such as heat resistant films is provided by plating (wet plating) and the metal film or the plated film such as heat resistant films is normal plating (smooth plating, i.e., plating performed at a current density below limiting current density), the metal film or the plated film does not affect the shape of the surface of the copper foil.

Although the limiting current density varies depending on concentrations of metal, pH, feed rates, distances between poles, and temperatures of plating solutions, the limiting current density as used herein is defined as the current density at the boundary between normal plating (a plated metal is deposited in a form of film) and roughened plating (burnt plating; a plated metal is deposited in a form of crystal (in a form of spherical, needle, icicle, etc.); it has irregularities), and the current density (visually determined) at the limit of normal plating (just before burnt plating) in the Hull cell test is determined to be the limiting current density.

Specifically, the concentrations of the metals, pH, and the temperature of the plating solution are set to the production conditions for plating, and the Hull cell test is conducted. The metal layer formation state (whether the plated metals are deposited in the form of layer or crystal) at the composition of the plating solution and at the temperature of the plating solution is then investigated. The current density at the boundary between normal plating and roughened plating is then determined from the position of the test piece where the boundary between normal plating and roughened plating exists, based on the current density quick reference table manufactured by YAMAMOTO-MS Co, Ltd. The current density at the boundary is then defined as the limiting current density. This gives the limiting current density at the composition of the plating solution and at the temperature of the plating solution. Generally, as a shorter distance between poles, the limiting current density tends to be higher.

The Hull cell test method is described, for example, in "Plating Practice Handbook" by Kiyoshi Maruyama, Jun. 30, 1983, pp. 157-160, Nikkan Kogyo Shimbun, Ltd.

To perform the plating process below the limiting current density, the current density during the plating process is preferably less than or equal to 20 $A/dm^2$, more preferably less than or equal to 10 $A/dm^2$, even more preferably less than or equal to 8 $A/dm^2$.

Further, the rust preventive film and the weather resistant film do not affect the shape of the surface of the copper foil because of their extremely thin thickness.

The shielding properties are improved when the number of layers of the ferromagnetic layers and the non-magnetic conductive metal layers is larger, while the bending neutral axis may not be included in the non-magnetic conductive metal layer on the bending outer side, so that the production cost increases as the number of layers increases and the shielding improvement effect tends to be saturated. Therefore, the number of non-magnetic conductive metal layers in the electromagnetic wave shielding material may be 3 or less, and the number of ferromagnetic layers may be 3 or less.

From the viewpoint of shielding properties, the ferromagnetic layers and the non-magnetic conductive metal layers may be alternately laminated.

The method of laminating the ferromagnetic layer and the non-magnetic conductive metal layer may be done by using an adhesive between the ferromagnetic layer and the non-magnetic conductive metal layer, or by thermocompression-bonding the ferromagnetic layer to the non-magnetic conductive metal layer without using any adhesive. The method of simply overlapping the layers without using any adhesive is also acceptable, but in view of the unity of the electromagnetic wave shielding material, it is preferable to join at least the edges (e.g., each side if the shielding material is square) by a tape or an adhesive, or by thermocompression bonding. However, from the viewpoint of not applying excess heat to the ferromagnetic layer, it is preferable to use an adhesive. The adhesive is as described above, including, but not limited to, acrylic resin-based adhesives, epoxy resin-based adhesives, urethane-based adhesives, polyester-based adhesives, silicone resin-based adhesives, vinyl acetate-based adhesives, styrene butadiene rubber-based adhesives, nitrile rubber-based adhesives, phenol resin-based adhesives, cyanoacrylate-based adhesives, and the like. Urethane-based adhesives, polyester-based adhesives, and vinyl acetate-based adhesives are preferred for reasons of ease of production and cost.

The thickness of the adhesive layer is preferably less than or equal to 100 μm. If the thickness of the adhesive layer is more than 100 μm, the bending neutral axis tends to be located within the thickness of the adhesive layer or the ferromagnetic layer, and the stress on the non-magnetic conductive metal layer and the ferromagnetic layer, which are the adherend layers, increases when the layer is bent, leading to ease of breakage. However, if the adhesive layer also serves as the ferromagnetic layer as described above, this is not the case, and the thickness can be as defined in the description of the ferromagnetic layer.

In addition, the Young's modulus of the adhesive layer is, for example, 50 to 10,000 MPa. Examples of methods for measuring the Young's modulus include the static measurement method and the resonance method.

According to one embodiment, it can have a magnetic field shielding property (how much the signal is attenuated on the receiving side) of 15 dB or more at 100 kHz, preferably 18 dB or more, more preferably 20 dB or more, even more preferably 24 dB or more, still more preferably 30 dB or more. In this invention, the magnetic field shielding property is measured by a KEC method. The KEC method refers to the "electromagnetic wave shielding property measurement method" in KEC Electronic Industry Development Center.

(Application)

In one embodiment, the present invention can be used for various electromagnetic wave shielding applications such as, particularly, covering or exterior materials for electrical and electronic apparatuses (e.g., inverters, communication devices, resonators, electron tubes and discharge lamps, electric heating devices, electric motors, generators, electronic components, printed circuits, medical devices, etc.), covering materials for harnesses and communication cables connected to electrical and electronic apparatuses, electromagnetic wave shielding sheets, electromagnetic wave shielding panels, electromagnetic wave shielding bags, electromagnetic wave shielding boxes, and electromagnetic wave shielding chambers.

EXAMPLES

The present invention will be specifically described based on Examples, Comparative Examples, and Reference Examples. The following Examples, Comparative Examples, and Reference Examples are only specific examples to facilitate understanding of the technical content of the present invention, and the technical scope of the present invention is not limited by these specific Examples.

In Table 1 below and FIG. 3, the "Magnetic Layer" means the ferromagnetic layer and the "Metal Layer" means the non-magnetic conductive metal layer.

[Preparation of Electromagnetic Wave Shielding Material]

In Examples 1 to 9 and Comparative Examples 1 to 4, materials A to H were used as shown in Table 1, with materials A to B prepared as the ferromagnetic layer and materials C to H prepared as the non-magnetic conductive metal layer. Each of materials C to H was then annealed at a material temperature of 200° C. for a heating retention time of 0.5 hours.

The materials A to H in Table 1 are as follows. An adhesive layer was formed on one surface of the composite sheets of the materials A and B. The relative permeability values of the materials A and B were described with reference to the graphs in the catalog.

Material A: Composite sheet (P100NH, manufactured by Takeuchi Kogyo, a relative permeability at 1 MHz frequency of about 130);

Material B: Composite sheet (GM010S, manufactured by Takeuchi Kogyo, a relative permeability at 1 MHz frequency of about 24);

Material C: Rolled copper foil (HA, manufactured by JX Advanced Metals Corporation);

Material D: Rolled copper foil (TPC (tough pitch copper according to JIS H3100 C1100, manufactured by JX Advanced Metals Corporation));

Material E: Electrodeposited copper foil (JXEFL-V2, manufactured by JX Advanced Metals Corporation);

Material F: Electrodeposited copper foil (commercially available product); Material G: Aluminum foil (JIS A8021 standard, commercially available product); and Material H: Electrodeposited copper foil (JX-UT, manufactured by JX Advanced Metals Corporation).

For each of the materials A to B, the Young's modulus was measured using a static measurement method. First, each of the materials A to B was punched out using a precision cutter to a length of 160 mm and a width of 12.7 mm, and a tensile test was conducted on the five punched samples. The samples that showed the maximum and minimum Young's moduli were excluded, and the average Young's modulus of the remaining three samples were determined to be the Young's modulus of the material. For the conditions for the samples, each sample was fixed to a test jig of a bench-top precision universal testing machine (Autograph AGS-X, manufactured by Shimadzu Corporation) with a gripping length of 30 mm and a chuck distance of 100 mm, and then pulled in the length direction (longitudinal direction) at a speed of 50 mm/min to calculate the Young's modulus (JIS K7127: 1999 standard).

Further, for each of the materials C to G after the above annealing treatment, the Young's modulus was measured using the resonance method. For the resonance method, a room temperature Young's modulus measuring device (TE-RT) manufactured by Nihon Techno-Plus Co., Ltd. was used. Measurements were carried out using samples obtained by cutting the materials C to G into strips each having a width of 10 mm and a length of 130 mm.

For the material H after the above annealing treatment, the Young's modulus was measured using the static measurement method. First, the material H was punched out using a precision cutter to a length of 150 mm and a width of 12.7 mm, and a tensile test was conducted out on five of the punched samples. The samples that showed the maximum and minimum Young's moduli were excluded, and the average Young's modulus of the remaining three samples was determined to be the Young's modulus of the material. The tensile test conditions were the same as those for the tensile tests on the materials A to B described above.

These results are shown in Table 1.

Next, in Examples 1 to 4 and 7 to 9, the following (A) electromagnetic wave absorbing auxiliary film, (B) heat resistant film, (C) rust preventive film, and (E) weather resistant film were formed in this order on the surfaces of the materials C to E after the annealing treatment as treated films. In Example 5, the following (A) electromagnetic wave absorbing auxiliary film, (B) heat resistant film, and (C) rust preventive film were formed in this order on the surface of the material F after the annealing treatment as treated films. In Example 6, the following (A) electromagnetic wave absorbing auxiliary film was formed on the surface of the material G after the annealing treatment as a treated film. In each of Comparative Examples 1, 3 to 4, the following (A) electromagnetic wave absorbing auxiliary film, (B) heat resistant film, and (D) rust preventive film were formed on the surface of the material H after the annealing treatment. In Comparative Example 2, the following (A) electromagnetic wave absorbing auxiliary film, (B) heat resistant film, (C) rust preventive film, and (D) rust preventive film were formed on the surface of the material H after the annealing treatment. The formation time was appropriately adjusted so that the thickness of the treated film would be about submicron ($10^{-1}$ μm).

(A) Electromagnetic Wave Absorption Auxiliary Film (Cu—Co—Ni Alloy Plating Treatment (Roughening Plating Treatment))

Liquid composition: 15.5 g/L of copper, 7.0 g/L of cobalt, 9.3 g/L of nickel;

pH: 2.3;

Liquid temperature: 36.0° C.;

Current density:

(Upper surface) first time: 21.3 A/dm$^2$, second time: 29.9 A/dm$^2$, third time: 56.8 A/dm$^2$;

(Lower surface) first time: 14.9 A/dm$^2$, second time: 26.1 A/dm$^2$, third time: 56.8 dm$^2$;

Coulomb amount:

(Upper surface) first time: 15.3 As/dm$^2$, second time: 21.5 As/dm$^2$, third time: 20.5 As/dm$^2$; and (Lower surface) first time: 10.7 As/dm$^2$, second time: 18.8 As/dm$^2$, third time: 27.4 As/dm$^2$;

(B) Heat Resistant Film (Co—Ni Alloy Plating Treatment)

Liquid composition: 12.5 g/L of nickel, 3.1 g/L of cobalt;

pH: 2.0;

Liquid temperature: 50° C.;

Current density: (upper surface) 17.5A/dm$^2$, (lower surface) 19.3A/dm$^2$; and Coulomb amount: (upper surface) 6.3 As/dm$^2$, (lower surface) 6.9 A/dm$^2$;

(C) Rust Preventive Film (Electrolytic Chromate Treatment)

Liquid composition: 3.0 g/L of potassium dichromate, 0.33 g/L of zinc;

Liquid temperature: 55° C.;

pH: 3.65;

Current density:

(Upper surface) first time: 1.0 A/dm$^2$, second time: 1.0 A/dm$^2$;

(Lower surface) 1.1 A/dm$^2$;

Coulomb amount:

(Upper surface) first time: 0.7 As/dm$^2$, second time: 0.7 As/dm$^2$; and (Lower surface) 0.8 As/dm$^2$;

(D) Rust Preventive Film (Benzotriazole Treatment)
Liquid composition: 40 mg/L;
Liquid temperature: 20° C. (room temperature);
pH: 2.0;
Current density: 0 A/dm2 (shower spray treatment); and
Processing time: 5 seconds.

(E) Weather Resistant Film (Silane Coupling Treatment)
Silane coupling agent: glycidoxypropyltrimethoxysilane;
Concentration of silane coupling agent: 0.1% by volume;
Treatment temperature: 20° C. (room temperature); and Next, in Examples 1 to 9 and Comparative Examples 1 to 4, the above surface-treated materials C to H were attached to the outer surfaces of the adhesive layers formed on the materials A to B, respectively, according to the configurations shown in Table 1. In this way, electromagnetic wave shielding materials were obtained in which the materials A to B and the above surface-treated materials C to H were laminated together.

<Evaluation Method>

(Seam Folding Test)

The electromagnetic shielding materials obtained in Examples 1 to 9 and Comparative Examples 1 to 4 were subjected to a seam folding test in the following order. The results are shown in Table 1.

(1) The electromagnetic shielding materials were cut with a cutter to a size of 30 mm wide and 50 mm long to prepare samples.
(2) The samples were lightly bent at ½ in the length direction so that the materials C to H were on the outside (see FIG. 2 (A)), and the samples were folded at 500 N for 1 second using a bench-top precision universal testing machine (Autograph AGS-X, manufactured by Shimadzu Corporation) (see FIG. 2 (B)).
(3) The samples were returned to their original state (see FIG. 2 (C)). In the returned state, the bench-top precision universal testing machine was used to press the samples down again at 500 N for 1 second (see FIG. 2 (D)).
(4) The appearance of each measured sample after the completion of the above (3) was visually confirmed. When it was confirmed that there were no cracks or peeling between materials A, B and materials C to H over more than half of the bent portion, the number of bending was confirmed by repeating the above (2) and (3).

It should be noted that if, after bending, peeling was found between materials A, B and materials C to H, or cracks were found over more than half of the bent portion, further bending was discontinued. The number of seam folding in the table is the number of folding at the time when the bending was discontinued minus 1. A number of seam folding of 3 or more can be considered to have good bendability.

(Estimation of Position Where Bending Neutral Axis is Present)

When the electromagnetic shielding materials obtained in Examples 1-9 and Comparative Examples 1-4 were bent at a curvature radius of 0.1 mm with the non-magnetic conductive metal layers C—H, which were the outermost layers, facing the outside, the position of the bending neutral axis present in the thickness of each layer was calculated based on the above equations I-V. The results are shown in Table 1.

It should be noted that since the thickness of the treated film was about submicron ($10^{-1}$ μm), the thickness of the treated film was not used for calculating the position of the bending neutral axis present.

(Expected Bending Strain)

The expected bending strain at the surface layer of the material A, which was the ferromagnetic layer, and the expected bending strains at the surface layers of the materials C and H, which were the nonmagnetic conductive metal layers, of the electromagnetic wave shielding materials obtained in Example 1 and Comparative Examples 1 and 4 were calculated based on the positional relationship from the bending neutral axis (equation VI). The results are shown in FIG. 3. According to FIG. 3, it can be seen that the bending neutral axes in Example 1, Comparative Example 1, and Comparative Example 4 is located at the metal layer (non-magnetic conductive metal layer), the magnetic layer (ferromagnetic layer), and the interface, respectively. When the bending neutral axis is located in the ferromagnetic layer, the tensile stress acts on the ferromagnetic layer, so that the ferromagnetic layer, which is weaker against the tensile stress than general metal materials, is easily broken. Further, when the bending neutral axis is located at the interface between the non-magnetic conductive metal layer and the ferromagnetic layer, shear stress acts between the two materials, the nonmagnetic conductive metal layer and the ferromagnetic layer, resulting in easy peeling. Therefore, by predicting the position of the bending neutral axis in the laminate, it is possible to predict the distribution of stress when bending and the ease of breakage.

[Equation VI]

$$\varepsilon = \frac{(r+z)\,d\theta - \mathrm{rd}\,\theta}{\mathrm{rd}\,\theta} = \frac{z}{r} \qquad \text{Equation VI}$$

$\varepsilon$: Bending Strain (Dimensionless)

$r$: Distance from Bending Center to Bending Neutral Surface ($\mu m$)

$z$: Distance from Bending Neutral Surface to Layer Surface for Determining Bending Strain ($\mu m$)

$\theta$: Infinitesimal Angle Difference (°)

TABLE 1

| | | Magnetic Layer | | | Metal Layer | | | | |
|---|---|---|---|---|---|---|---|---|---|
| | Configuration of Laminate | Types | Young's Modulus [GPa] | Thickness [μm] | Types | Young's Modulus after Annealing (MD) [GPa] | Thickness [μm] | Number of Seam Folding | Position of Bending Neutral Axis in Thickness (R = 0.1 mm) |
| Example 1 | Magnetic Layer/Metal Layer | Material A | 0.366 | 70 | Material C | 76 | 12 | 3 | Metal Layer |
| Example 2 | Magnetic Layer/Metal Layer | Material A | 0.366 | 70 | Material C | 76 | 18 | 4 | Metal Layer |
| Example 3 | Magnetic Layer/Metal Layer | Material A | 0.366 | 70 | Material D | 105 | 35 | 10 or more | Metal Layer |
| Example 4 | Magnetic Layer/Metal Layer | Material A | 0.366 | 70 | Material E | 250 | 18 | 6 | Metal Layer |
| Example 5 | Magnetic Layer/Metal Layer | Material A | 0.366 | 70 | Material F | 180 | 18 | 3 | Metal Layer |
| Example 6 | Magnetic Layer/Metal Layer | Material A | 0.366 | 70 | Material G | 70 | 36 | 10 or more | Metal Layer |
| Example 7 | Magnetic Layer/Metal Layer | Material B | 0.26 | 95 | Material E | 250 | 18 | 17 | Metal Layer |
| Example 8 | Magnetic Layer/Metal Layer | Material B | 0.26 | 95 | Material C | 76 | 18 | 13 | Metal Layer |
| Example 9 | Magnetic Layer/Metal Layer | Material B | 0.26 | 95 | Material D | 105 | 18 | 8 | Metal Layer |
| Comparative Example 1 | Magnetic Layer/Metal Layer | Material A | 0.366 | 70 | Material H | 81 | 1.2 | 1 | Magnetic Layer |
| Comparative Example 2 | Magnetic Layer/Metal Layer | Material A | 0.366 | 70 | Material H | 81 | 1.2 | 1 | Magnetic Layer |
| Comparative Example 3 | Magnetic Layer/Metal Layer | Material A | 0.366 | 70 | Material H | 81 | 3 | 2 | Magnetic Layer |
| Comparative Example 4 | Magnetic Layer/Metal Layer | Material A | 0.366 | 70 | Material H | 69 | 5 | 2 | Interface between Magnetic Layer and Metal Layer |

(Discussion of Examples)

In Examples 1 to 9, the number of seam folding was 3 or more. As a result, in Examples 1 to 9, when the material was bent at a radius of curvature of 0.1 mm with the outermost non-magnetic conductive metal layer outside, the bending neutral axis was located within the thickness of the outermost non-magnetic conductive metal layer, which is presumably effective in suppressing cracks and the like during use as an electromagnetic shielding material (particularly during bending).

On the other hand, in Comparative Examples 1 to 3, the number of seam folding was less than 3. This would be because when the material was bent at a radius of curvature of 0.1 mm with the outermost non-magnetic conductive metal layer outside, the bending neutral axis was located within the thickness of the ferromagnetic layer, so that the tensile stress acted on the ferromagnetic layer susceptible to the tensile stress, leading to breakage.

In Comparative Example 4, the number of seam folding was less than 3. This would be because when bending at a curvature radius of 0.1 mm with the outermost non-magnetic conductive metal layer outside, the bending neutral axis was located at the interface between the non-magnetic conductive metal layer and the ferromagnetic layer, so that the bending stress was 0 (zero), but the shear stress was maximized, so that the materials at the interface were peeled off, leading to the breakage.

The invention claimed is:

1. An electromagnetic wave shielding material comprising a laminate having at least one non-magnetic conductive metal layer and at least one ferromagnetic layer laminated together, wherein at least one outermost layer of the laminate is the non-magnetic conductive metal layer, and wherein, when the electromagnetic wave shielding material is bent at a radius of curvature of 0.1 mm with an outermost non-magnetic conductive metal layer positioned on a bending outer side, a bending neutral axis is located within a thickness of the outermost non-magnetic conductive metal layer.

2. The electromagnetic wave shielding material according to claim 1, wherein the other outermost layer of the laminate is the ferromagnetic layer.

3. The electromagnetic wave shielding material according to claim 1, wherein a Young's modulus of each non-magnetic conductive metal layer is higher than that of each ferromagnetic layer, and wherein a thickness of each non-magnetic conductive metal layer is lower than that of each ferromagnetic layer.

4. The electromagnetic wave shielding material according to claim 1, wherein the non-magnetic conductive metal layer comprises at least one selected from copper, a copper alloy, aluminum, and an aluminum alloy.

5. A covering material or an exterior material for electrical and electronic apparatuses, the covering material or the exterior material comprising the electromagnetic wave shielding material according to claim 1.

6. An electrical apparatus comprising the covering material or the exterior material according to claim 5.

* * * * *